United States Patent
Conte et al.

(10) Patent No.: US 10,281,512 B2
(45) Date of Patent: May 7, 2019

(54) TESTING CIRCUIT OF A LONGTIME-CONSTANT CIRCUIT STAGE AND CORRESPONDING TESTING METHOD

(71) Applicants: STMicroelectronics S.r.l., Agrate Brianza (IT); STMicroelectronics (Crolles 2) SAS, Crolles (FR); STMicroelectronics (Rousset) SAS, Rousset (FR)

(72) Inventors: Antonino Conte, Tremestieri Etneo (IT); Enrico Castaldo, Catania (IT); Raul Andres Bianchi, Myans (FR); Francesco La Rosa, Rousset (FR)

(73) Assignees: STMicroelectronics (Rousset) SAS, Rousset (FR); STMicroelectronics S.r.l., Agrate Brianza (MB) (IT); STMicroelectronics (Crolles 2) SAS, Crolles (FR)

( * ) Notice: Subject to any disclaimer, the term of this patent is extended or adjusted under 35 U.S.C. 154(b) by 323 days.

(21) Appl. No.: 15/387,370

(22) Filed: Dec. 21, 2016

(65) Prior Publication Data

US 2018/0003761 A1 Jan. 4, 2018

(30) Foreign Application Priority Data

Jun. 29, 2016 (IT) .................... 102016000067266

(51) Int. Cl.
*G01R 31/02* (2006.01)
*G01R 31/28* (2006.01)
*G04F 10/10* (2006.01)

(52) U.S. Cl.
CPC ....... *G01R 31/028* (2013.01); *G01R 31/2882* (2013.01); *G04F 10/10* (2013.01)

(58) Field of Classification Search
CPC .................... G01R 31/016; G01R 31/028; G01R 27/2617; H04M 3/305; G11C 29/00;

(Continued)

(56) References Cited

U.S. PATENT DOCUMENTS

| | | | | |
|---|---|---|---|---|
| 5,659,254 A * | 8/1997 | Matsumoto | .......... | G01D 5/2417 324/548 |
| 6,518,777 B2 * | 2/2003 | Kamitani | ............. | G01R 27/025 324/548 |

(Continued)

*Primary Examiner* — Tung X Nguyen
*Assistant Examiner* — Robert P Alejnikov, Jr.
(74) *Attorney, Agent, or Firm* — Slater Matsil, LLP

(57) ABSTRACT

A method can be used for testing a charge-retention circuit for measurement of a time interval having a storage capacitor coupled between a first biasing terminal and a floating node, and a discharge element coupled between the floating node and a reference terminal. The discharge element is configured to implement discharge of a charge stored in the storage capacitor by leakage through a corresponding dielectric. The method includes biasing the floating node at a reading voltage, detecting a biasing value of the reading voltage, implementing an operation of integration of the discharge current in the discharge element with the reading voltage kept constant at the biasing value, and determining an effective resistance value of the discharge element as a function of the operation of integration.

22 Claims, 9 Drawing Sheets

(58) Field of Classification Search
CPC ......... G11C 29/08; G11C 29/12; G11C 29/48; G11C 29/50; G11C 2229/00; G11C 11/401; G11C 16/06; G11C 16/10; G11C 16/26; G11C 16/30; G11C 16/3418
USPC ............ 324/548, 519; 365/201, 149, 185.18, 365/185.15, 185.25
See application file for complete search history.

(56) References Cited

U.S. PATENT DOCUMENTS

| | | | | |
|---|---|---|---|---|
| 2006/0244545 | A1* | 11/2006 | Briskin | H03K 5/13 331/135 |
| 2010/0020648 | A1* | 1/2010 | La Rosa | G11C 27/005 368/107 |
| 2011/0007567 | A1* | 1/2011 | Modave | G06F 21/75 365/185.04 |
| 2015/0043269 | A1* | 2/2015 | La Rosa | G11C 27/024 365/149 |
| 2016/0029129 | A1* | 1/2016 | Nicollini | H04R 19/04 381/113 |

* cited by examiner

TESTING CIRCUIT OF A LONGTIME-CONSTANT CIRCUIT STAGE AND CORRESPONDING TESTING METHOD

CROSS-REFERENCE TO RELATED APPLICATIONS

This application claims priority to Italian Application No. 102016000067266, filed on Jun. 29, 2016, which application is hereby incorporated herein by reference.

TECHNICAL FIELD

The present invention relates to a testing circuit of a long-time-constant (LTC) circuit stage, and to a corresponding testing method.

BACKGROUND

There are several applications in which in an electronic device it is required to wait for a pre-set time, which may even have a long duration (minutes or hours). It may further be required for this wait time to be measured also when the electronic device is in a state where it is turned off, de-activated, or blocked.

For example, in applications for secure microcontrollers (the so-called secure MCUs), e.g., for operations of authentication, communication, or secure storage of information, if an attack is detected aimed at stealing sensitive information, the electronic device in which the secure microcontroller is used is set in a disabled state.

Typically, in the case of repeated attacks, the electronic device is set in a definitive disabled state for protecting the sensitive information. However, this behavior of defense entails subsequent impossibility for the user to operate the electronic device.

It is thus preferable to set the electronic device in a blocking state for a time sufficiently long (minutes or hours) for preventing the attack from being successful (it is difficult to violate the device if, after an attack, it is necessary to wait for a long period of time to unblock the same electronic device), at the same time preserving the possibility for the user to continue to operate the device.

For this purpose, a long-time-constant circuit stage (in what follows "LTC stage") is used, basically constituted by a charge-retention electronic circuit, which defines an extremely long RC time constant for discharge of a previously stored electric charge (this time constant determines the wait time interval prior to restoring functionality of the electronic device). The resistance defining the RC time constant may have, for example, values of the order of $P\Omega$ ($10^{15} \Omega$) for defining a discharge time of the order of minutes or even hours.

The LTC stage may be further set (programmed), or reset (erased), by applying appropriate biasing signals.

An LTC stage is described, for example, in US 2015/0043269 A1. This LTC stage is illustrated in FIG. 1, where it is designated by 1, and is basically a charge-retention electronic circuit for time measurement, which includes a capacitive charge-storage element in which discharge occurs by a slow process of leakage through the dielectric space of the same capacitive element.

In particular, the LTC stage 1 comprises: a storage capacitor 2, connected between a first biasing terminal 3a, set in use at a first biasing voltage $V_1$, and a floating node 4; a transfer capacitor 5, connected between a second biasing terminal 3b, set in use at a second biasing voltage $V_2$, and the floating node 4; and a discharge element 6, connected between the same floating node 4 and a reference terminal 7, set in use at a reference voltage, or ground (gnd).

In particular, the discharge element 6 is formed by a plurality of elementary discharge units 8, which are connected together in series between the aforesaid floating node 4 and the aforesaid reference terminal 7 and define between them a plurality of intermediate nodes Ni (where i is an integer corresponding to the number of elementary discharge units 8 minus one).

As described in detail in the aforesaid US 2015/0043269 A1, each elementary discharge unit 8 comprises a capacitive element formed by a first electrode and a second electrode (made, for example, of polysilicon), arranged between which is a thin dielectric layer, through which a transfer of charges occurs by the tunnel effect. The connection in series between the various elementary discharge units 8 is implemented by coupling between the first electrode or the second electrode of consecutive elementary discharge units 8 in the series.

The floating node 4 is kept isolated, separated by a dielectric space, from the terminals where the voltage is applied and is not directly connected to any non-isolated region of the substrate of semiconductor material in which the LTC stage 1 is provided.

The capacitance $C_1$ of the storage capacitor 2 (for example, comprised between 1 and 100 pF) is much higher than the capacitance $C_2$ of the transfer capacitor 5 (for example, comprised between 0.01 and 50 pF); moreover, the thickness of the dielectric layer of the storage capacitor 2 (for example, comprised between 150 and 200 Å), made, for example, of oxide-nitride-oxide (ONO) dielectric, is greater than the respective thickness of the transfer capacitor 5 (for example, comprised between 70 and 100 Å), made of tunnel oxide.

Basically, the function of the storage capacitor 2 is that of retention of electric charges, whereas the function of the transfer capacitor 5 is that of enabling injection, or extraction, of charges in, or from, the storage capacitor 2, in particular by the tunnel effect, in a way altogether similar to what occurs for the floating-gate terminal of a nonvolatile memory.

Each of the elementary discharge units 8 has characteristics, for example in terms of thickness of the corresponding dielectric layer, such as to have a non-negligible charge leakage over time, through the corresponding dielectric space. Furthermore, the overall resistance of the discharge element 6, defined jointly by the various elementary discharge units 8, is extremely high, for example of the order of $T\Omega$ or $T\Omega$.

The function of the discharge element 6 is to discharge in a controlled way, in a sufficiently long time interval (of the order of minutes or hours), the charge stored in the storage capacitor 2.

In use, the following operations may be envisaged in the LTC stage 1.

A programming operation, the so-called set, is used for initialization of the charge in the storage capacitor 2, by applying a high potential difference, for example positive, between the first and second biasing terminals 3a, 3b, for a consequent injection of electric charges through the transfer capacitor 5. For example, a high positive voltage +HV (boosted with respect to a logic supply voltage, for instance, via a charge-pump stage) is applied on the first biasing terminal 3a, and a high negative voltage −HV is applied on the second biasing terminal 3b.

An operation of reset, or erasure, of the charge stored in the storage capacitor 2, is implemented by applying a high potential difference, for example negative, between the first and second biasing terminals 3a, 3b, for a consequent extraction of charges through the transfer capacitor 5. For example, the high negative voltage −HV is applied on the first biasing terminal 3a, and the high positive voltage +HV is applied on the second biasing terminal 3b; and An operation of reading of the residual charge present in the storage capacitor 2 is implemented by detecting the voltage on the floating node 4, or on one or more of the intermediate nodes Ni, during discharge of the charge in the storage capacitor 2 (stored in a previous programming operation). This discharge occurs through the discharge element 6, with the first and second biasing terminals 3a, 3b set at ground, the discharge time constant RC being the product of the resistance of the discharge element 6 and of the overall capacitance of the storage capacitor 2 and transfer capacitor 5 (which are connected in parallel together and in parallel to the discharge element 6).

As shown in greater detail in FIG. 2, a reading circuit 9 of the LTC stage 1 comprises an operational amplifier 10 (in particular, an operational transconductance amplifier—OTA), operating as a comparator, having a first input terminal boa, for example the negative input terminal, connected to the floating node 4, a second input terminal 10b, in the example the positive input terminal, which receives a comparison reference voltage $V_x$, of an appropriate value, and an output 10c, which supplies an output voltage $V_{out}$, the value of which is indicative of the residual charge in the storage capacitor 2.

In particular, if the reading voltage $V_L$ on the floating node 4 has a given relation with the comparison reference voltage $V_x$ (for example, being lower or higher than the same comparison reference voltage $V_x$), the discharge step of the storage capacitor 2 may be considered completed (for example, for the purpose of unblocking the electronic device that had previously been blocked due to detection of an attack attempt).

The value of the comparison reference voltage $V_x$ is thus defined at the design stage for setting the desired duration of the discharge interval.

Likewise, as shown schematically in the aforesaid FIG. 1, further comparator stages (designated by $10_i$) may be provided, connected to one or more of the intermediate nodes $N_i$, in order to detect the voltage on the same intermediate nodes $N_i$ and compare it with a respective reference voltage.

The present Applicant has realized that the solution described previously has a problem associated to a high spread of the duration of the discharge interval.

In particular, the value of the resistance of the discharge element 6, which in the integrated embodiment is made of semiconductor material (for example, silicon), may have a spread that may reach +/−40% of a nominal design value. This variability has repercussions on the value of the discharge RC time constant and, likewise, on the duration of the discharge interval.

This problem is illustrated in FIG. 3, which shows the plot of the reading voltage $V_L$ on the floating node 4 (in the example, with opposite sign) during discharge of the charge stored in the storage element 2; in particular, represented with a dashed line is the ideal plot, on the hypothesis of the resistance of the discharge element 6 having the nominal design value $R_L$, whereas represented with a solid line is the actual plot, due to the effective value $R_L'$ of the same resistance, due to the process spread.

As illustrated, an ideal duration $T_S$ of the discharge interval would be associated to the selected design value, designated by $V_{x1}$, of the comparison reference voltage $V_x$, whereas the effective duration $T_S'$ of the same discharge interval is sensibly different, in the example shorter.

Likewise, to obtain the ideal duration $T_S$ of the discharge interval, it would be required use of a comparison reference voltage $V_x$ having a value $V_{x2}$ that in the example is lower than the design value $V_{x1}$.

Basically, the actual performance of the LTC stage 1 is different from the desired design performance, with consequent problems of reliability in the operation of the electronic device in which the LTC stage 1 is used (e.g., causing a reduction in the security performance).

For example, in a wide range of applications it is not always possible to accept a spread in the duration of the discharge interval greater than +/−20% of the declared value.

A possible solution to this problem may consist in the measurement, at a testing step subsequent to the integrated manufacturing process (coinciding with the so-called electrical wafer sorting—EWS), of the effective duration of the discharge interval, in order to implement, as a function of the detected duration, a calibration of the comparison reference voltage $V_x$ such as to compensate the variation of the value of resistance of the discharge element 6.

With reference once again to FIG. 3, in fact, by regulating the comparison reference voltage $V_x$ at a compensation value $V_{x2}$, an effective duration $T_S'$ of the discharge interval substantially equivalent to the desired design one could be obtained.

As mentioned previously, however, this discharge interval may have a duration of minutes or even hours so that its measurement may be incompatible with the times required for the testing operations at the end of the manufacturing process, which typically must not be longer than a few minutes for each electronic device produced (a longer duration would in fact entail an unacceptable reduction in the throughput of the manufacturing process).

SUMMARY

Embodiments of the present invention solve, at least in part, the aforesaid problems, and, in particular embodiments, provide an improved testing circuit for an LTC stage that will afford improved performance and, in particular, will enable a shorter duration compatible with electrical testing of integrated devices.

According to the present invention, a testing circuit and a corresponding testing method are consequently provided.

In one embodiment, testing circuit comprises a charge-retention circuit stage for measurement of a time interval. The charge-retention is provided with a storage capacitor connected between a first biasing terminal and a floating node, and a discharge element connected between the floating node and a reference terminal and designed to implement discharge of a charge stored in the storage capacitor by leakage through a corresponding dielectric. The testing circuit also comprises a biasing stage, configured to bias the floating node at a reading voltage. A detection stage is configured to detect the biasing value of the reading voltage. An integrator stage, including a test capacitor coupled to the floating node, is configured to implement an operation of integration of a discharge current in the discharge element with the reading voltage kept constant at the biasing value, and to determine an effective resistance value of the discharge element as a function of the integration operation.

Other embodiments are disclosed herein.

BRIEF DESCRIPTION OF THE DRAWINGS

For a better understanding of the present invention, a preferred embodiment thereof is now described, purely by way of non-limiting example and with reference to the attached drawings, wherein.

DETAILED DESCRIPTION OF ILLUSTRATIVE EMBODIMENTS

As will be clarified in detail hereinafter, one aspect of the present solution envisages providing a measurement of the effective value $R_L'$ of the resistance of the discharge element 6, in a testing phase, for example subsequent to manufacturing of the LTC stage 1, in order to adjust accordingly the value of the comparison reference voltage $V_x$ and thus the effective duration $T_S'$ of the discharge interval (so that it is substantially equivalent to the desired design value).

Measurement of the aforesaid effective value $R_L'$ of the resistance of the discharge element 6 entails, however, several issues, amongst which the difficulty of accessing the terminals of the discharge element 6 without perturbing and modifying its electrical parameters, in particular without altering the value of the RC discharge time constant. In this regard, it should be considered that the current circulating in the discharge element 6 has extremely low values, of the order of fA.

Figure 4:
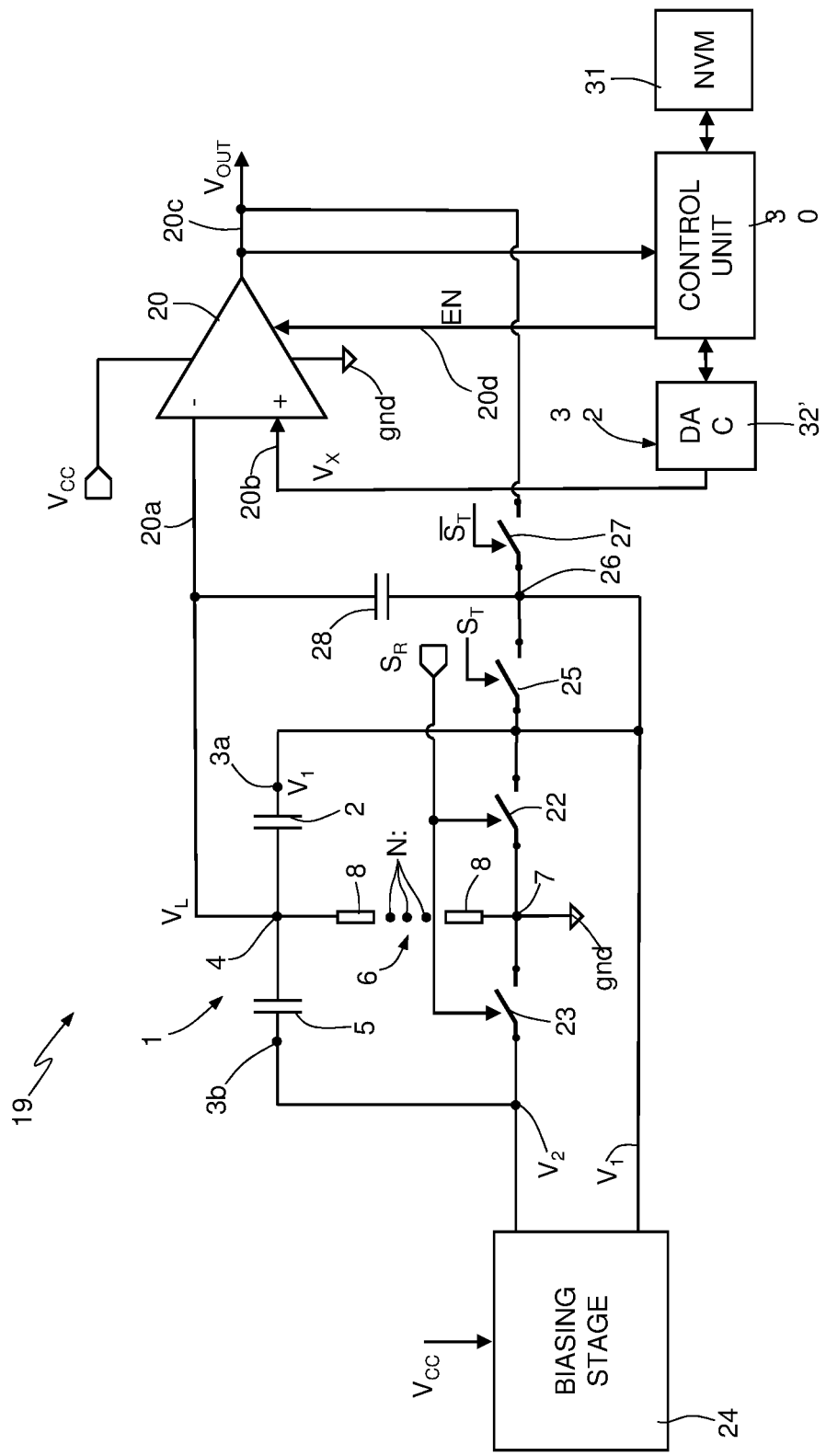
FIG. 4 shows a testing circuit of an LTC stage, according to one embodiment of the present solution.

FIG. 4 shows a testing circuit 19 for an LTC stage, configured so as to provide a solution to the above issue.

The LTC stage, once again designated by 1, includes, as described previously (and as described in detail in the aforesaid US 2015/0043269 A1): the storage capacitor 2, connected between the first biasing terminal 3a, set in use at the first biasing voltage $V_1$, and the floating node 4; the transfer capacitor 5, connected between the second biasing terminal 3b, set in use at the second biasing voltage $V_2$, and the floating node 4; and the discharge element 6, connected between the same floating node 4 and the reference terminal 7, and formed by a plurality of elementary discharge units 8, which are connected together in series and which define between them the intermediate nodes Ni.

The testing circuit 19 comprises an operational amplifier 20 (for example, an operational transconductance amplifier—OTA), having a first input terminal 20a, for example the negative input terminal, connected to the floating node 4, a second input terminal 20b, in the example the positive input terminal, which receives the comparison reference voltage $V_x$, having in this case an adjustable value (as described in detail hereinafter), and an output terminal 20c, which supplies the output voltage $V_{out}$. The operational amplifier 20 also has an enabling input terminal 20d, which receives an enable signal EN.

The testing circuit 19 further comprises additional elements. A first switch element 22, connected between the first biasing terminal 3a and the reference terminal 7, is driven by a read control signal $S_R$. A second switch element 23, connected between the second biasing terminal 3b and the reference terminal 7, is driven by the same read control signal $S_R$. A biasing stage 24 is configured to generate, starting from a supply voltage $V_{cc}$, appropriate biasing voltages $V_1$, $V_2$ for the first and second biasing terminals 3a, 3b of the LTC stage 1.

In particular, the enable signal EN is conveniently timed with respect to the read control signal $S_R$, for example being generated with synchronized switchings, or with an appropriate time delay, with respect to the switching of the same control signal $S_R$.

According to a particular aspect of the present solution, the testing circuit 19 further comprises switch elements 25 and 27 and test capacitor 28. The third switch element 25 is connected between the first biasing terminal 3a and an internal node 26 and is driven by a test control signal $S_T$. The fourth switch element 27 is connected between the aforesaid internal node 26 and the output terminal 20C of the operational amplifier 20 and is driven by the negated version ($\overline{S_T}$) of the test control signal $S_T$. The test capacitor 28 is connected between the floating node 4 and the internal node 26 and has a capacitance $C_T$ lower than the capacitance $C_1$ of the storage capacitor 2.

The fourth switch element 27 thus selectively defines a feedback path for the operational amplifier 20, which includes the test capacitor 28.

In particular, the test capacitor 28 is obtained as a split of the storage capacitor 2, and shares, for example, an electrode plate with the same storage capacitor 2. In other words, the sum of the capacitance $C_T$ of the test capacitor 28 and of the effective, residual, capacitance $C_1'$ of the storage capacitor 2 corresponds to an expected value of the capacitance $C_1$ of the same storage capacitor 2 in the absence of the test capacitor 28; for example, the capacitance $C_T$ of the test capacitor 28 is 1/20 of the capacitance $C_1$, and consequently the effective capacitance $C_1'$ of the storage capacitor 2 is 19/20 of the capacitance $C_1$.

The testing circuit 19 further comprises a control unit 30, for example including a microprocessor, a microcontroller, a field-gate programmable array (FPGA), a digital signal processor (DSP), or a similar logic processing unit, having an input that is coupled to the output terminal 20C of the operational amplifier 20 and receives the output voltage $V_{out}$.

A non-volatile memory 31 is coupled to the control unit 30, which is able to read and write information in the same non-volatile memory 31. A reference-variation stage 32 is coupled to the control unit 30 and controlled by the same control unit 30 for varying the value of the comparison reference voltage $V_x$ that is supplied to the second input 20b of the operational amplifier 20. For example, the reference-variation stage 32 may comprise a digital-to-analog converter (DAC) 32', designed to generate iteratively, at successive incremental steps, incremental values of the comparison reference voltage $V_x$ according to a staircase pattern.

In a possible embodiment, the control unit 30 generates the read control signal $S_R$, the enable signal EN, and the test control signal $S_T$, with appropriate mutual timings (as will be evident from the ensuing description).

Operation of the testing circuit 19 is now discussed, which is designed, in general, to enable calibration of the comparison reference value $V_x$ as a function of the real value $R_L'$ of the discharge element 6, which is subjected, as mentioned previously, to considerable variations on account, for example, of manufacturing process spread.

Figure 1:
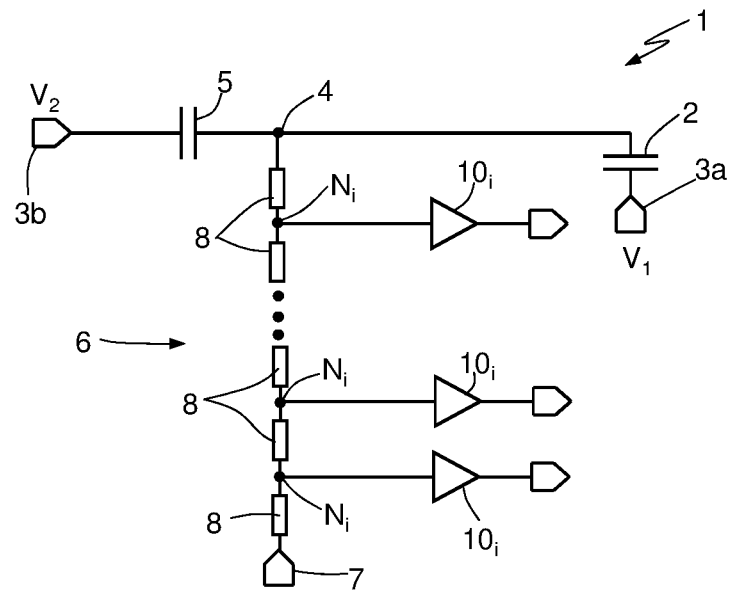
FIG. 1 shows the circuit diagram of an LTC stage of a known type.
Figure 2:
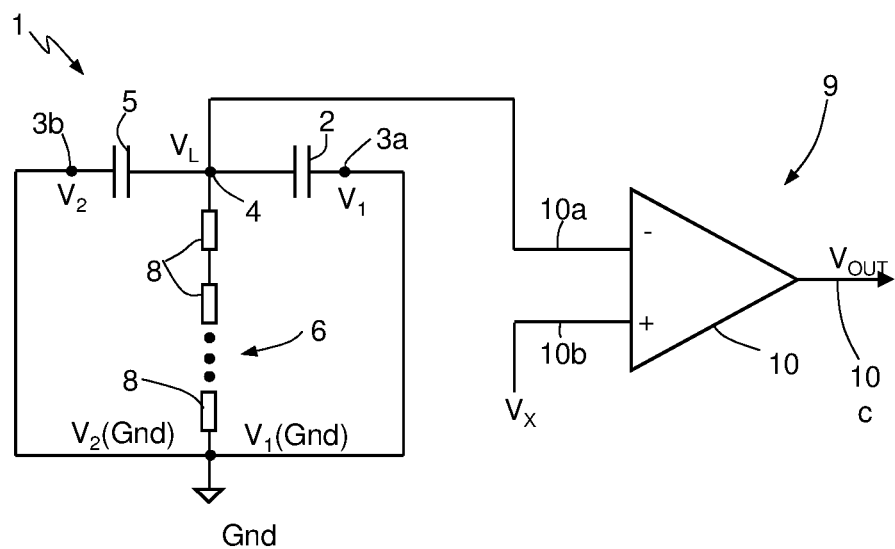
FIG. 2 shows a reading stage associated to the LTC stage of FIG. 1, being also of a known type.
Figure 3:
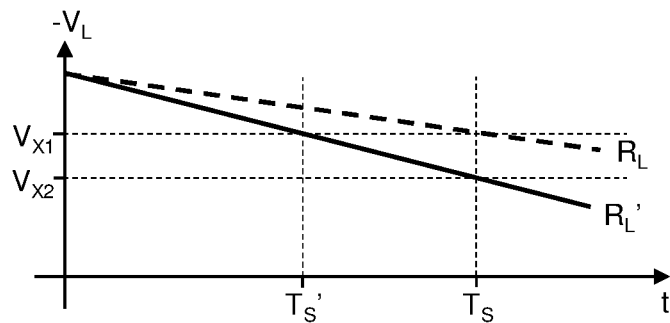
FIG. 3 shows a plot corresponding to electrical quantities associated to the reading stage of FIG. 2.
Figure 5:
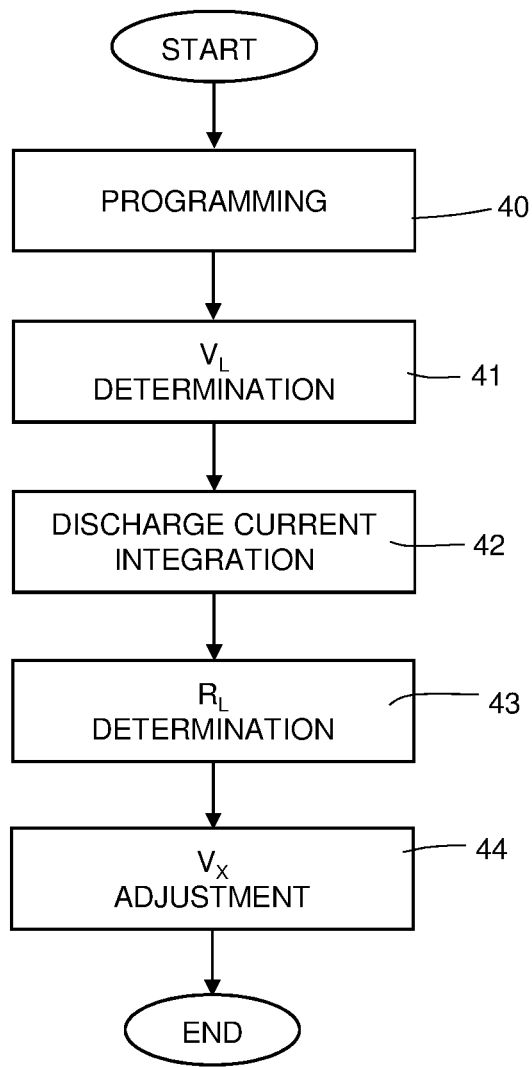
FIG. 5 is a general flowchart corresponding to a procedure for testing the LTC stage, according to an aspect of the present solution.

In general, and as illustrated in FIG. 5, a test procedure implemented by the testing circuit 19 initially envisages programming (step 40) of the LTC stage 1, by storing charges in the storage capacitor 2. For this purpose, as described hereinafter, using the biasing stage 24 appropriate biasing voltages $V_1$, $V_2$ are applied to the biasing terminals 3a, 3b. Following upon this biasing operation, a reading voltage $V_L$ is present on the floating node 4, and thus on the discharge element 6.

Next (step 41), the value of the reading voltage $V_L$ is determined via a search by successive approximations carried out by the reference-variation stage 32 under the supervision of the control unit 30.

The reading voltage $V_L$ (step 42) is then forcedly kept constant at the value that has been previously determined, by the feedback loop defined by the operational amplifier 20, while a discharge current, of a value kept constant, circulating in the discharge element 6 flows entirely towards the test capacitor 28. This discharge current in the test capacitor 28 is thus integrated by the operational amplifier 20, which operates as an integrator with the capacitance $C_T$ of the test capacitor 28 that defines the integration capacitance.

The output voltage $V_{out}$ on the output terminal 20c of the operational amplifier 20 is then measured (step 43) at an initial discharge instant $t_o$ and then after a pre-set measurement time interval $\Delta T$. The law that governs the voltage variation $\Delta V_{out}$ is known (being the law that governs discharge at constant current of the test capacitor 28) and, on the basis of the same law, it is possible to determine the effective value of resistance $R_L'$ of the discharge element 6 (as described in detail hereinafter).

The value of the comparison reference voltage $V_x$ may then be adjusted (step 44) as a function of the effective value of resistance $R_L'$ determined previously for guaranteeing a desired duration, according to design, of the discharge interval of the LTC stage 1 during subsequent operation (for example, for secure applications).

Figure 6A:
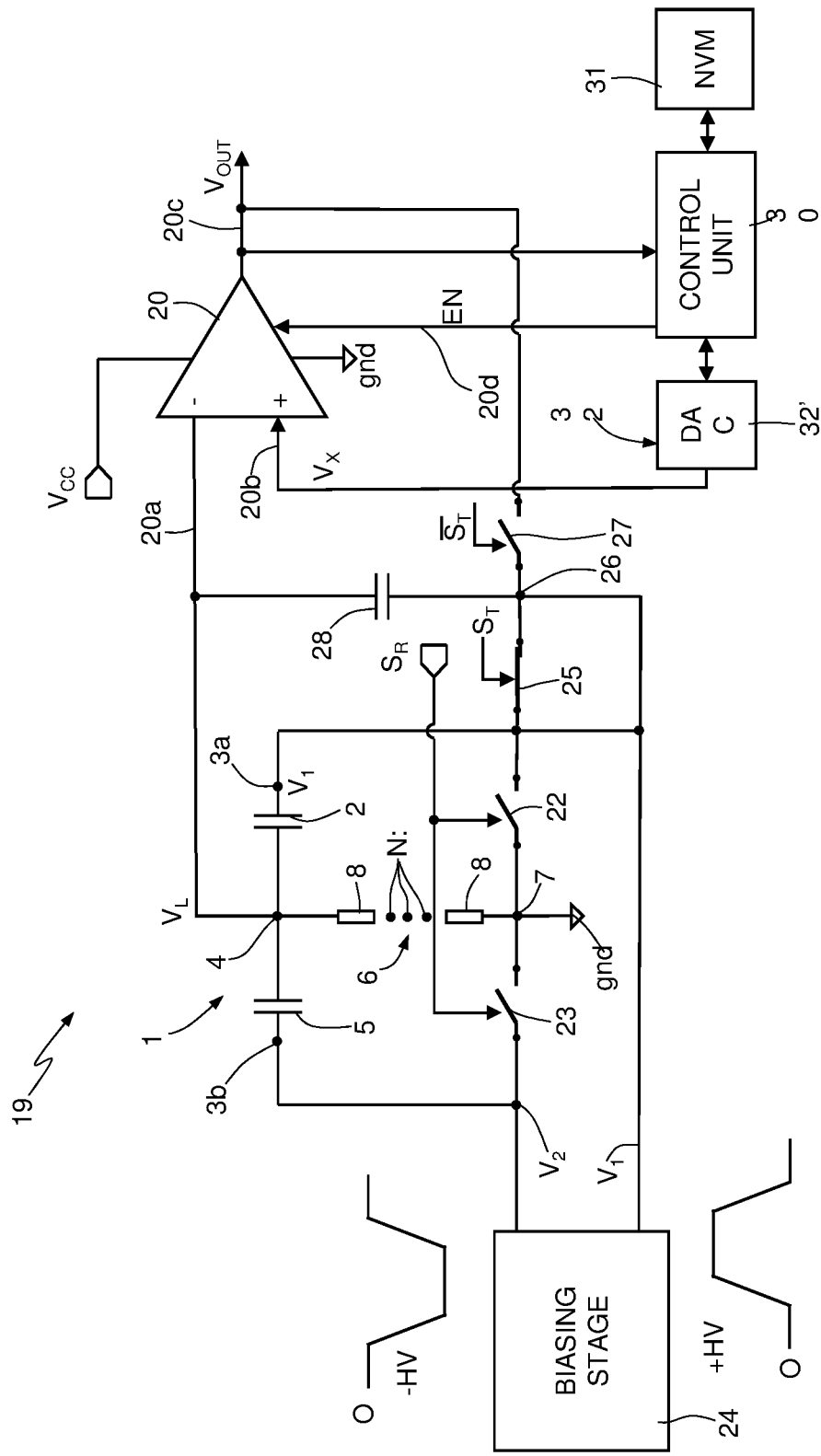
FIGS. 6a-6c show the testing circuit of FIG. 4, in different test operating conditions.

In greater detail, and with initial reference to FIG. 6a, in the first step of the test procedure, the first and second switch elements 22, 23 are switched into the open state by the read control signal SR; the LTC stage 1 is thus pre-arranged for the programming operation.

Furthermore, the third switch element 25 is switched into the closed state, and, consequently, the fourth switch element 27 is switched into the open state by the test control signal $S_T$. In particular, closing of the third switch element 25 sets in parallel the storage capacitor 2 and the test capacitor 28 so as not to alter the overall value of capacitance $C_1$ envisaged according to design for the same storage capacitor 2, and opening of the fourth switch element 27 opens the feedback path of the operational amplifier 20, once again not altering functionality of the LTC stage 1 in this operating step.

Programming of the LTC stage 1 occurs, as described previously, by biasing the first biasing terminal 3a, in the example with a positive voltage pulse (from ground to the high positive voltage +HV) in the first biasing voltage $V_1$, and the second biasing terminal 3b, in the example with a negative voltage pulse (from ground to the high negative voltage −HV) in the second biasing voltage $V_2$. This determines charge injection by the tunnel effect from the transfer capacitor 5 to the storage capacitor 2 and a programming value of the reading voltage $V_L$ is defined on the floating node 4.

Next, the biasing voltages $V_1$, $V_2$, are both brought back to the ground value gnd.

Figure 6B:
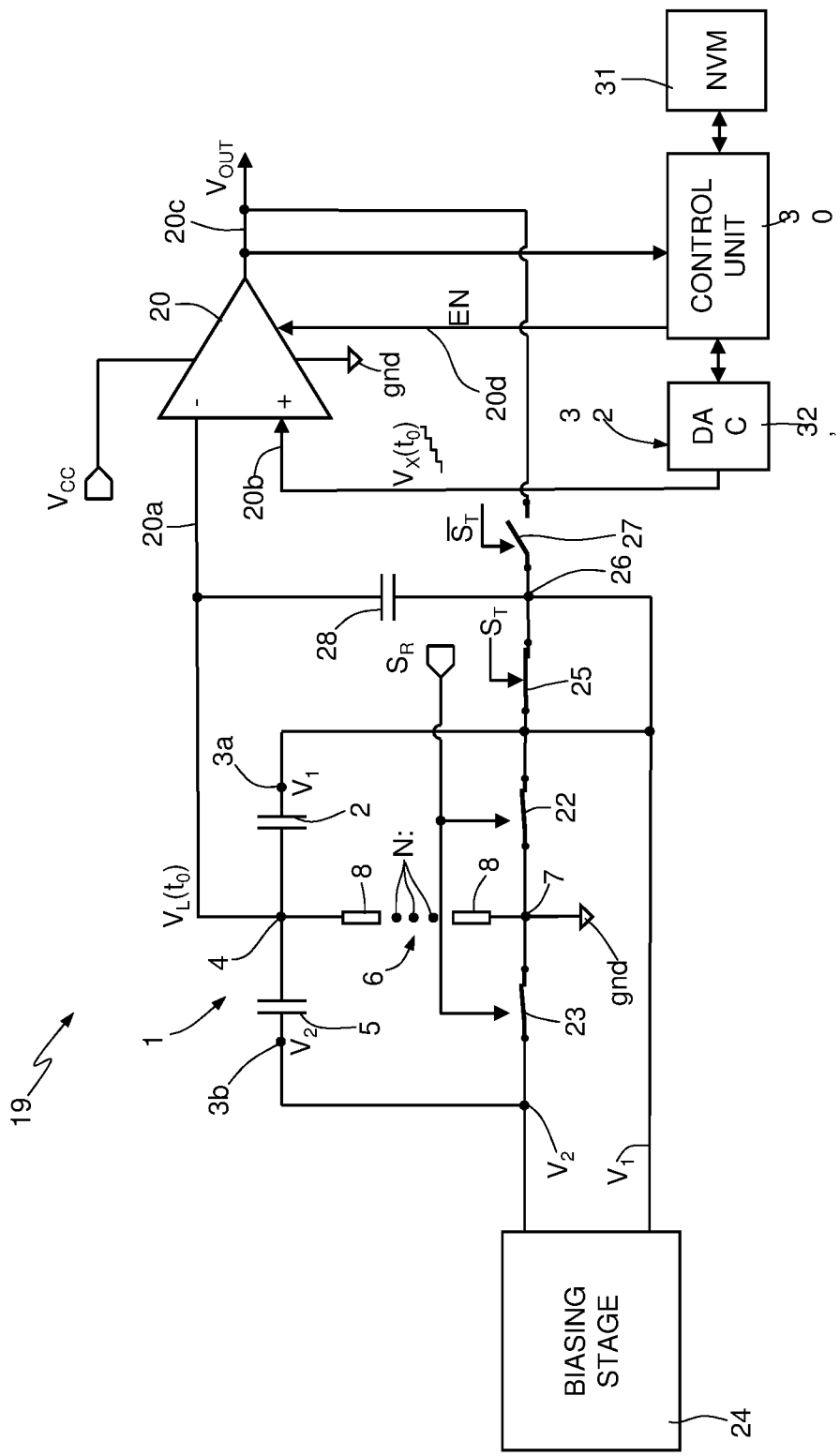

In the second step of the test procedure, as shown in FIG. 6b, the first and second switch elements 22, 23 are switched into the closed state by the read control signal SR (thus shorting to ground the first and second biasing terminals 3a, 3b). The LTC stage 1 is thus pre-arranged for the reading operation of the reading voltage $V_L$.

The third switch element 25 and the fourth switch element 27 are not switched, once again in order not to alter functionality of the LTC stage 1 and preparing the operational amplifier 20 to operate as a voltage comparator for the reading operation.

In particular, the read operation is enabled by the read-enable signal EN received by the operational amplifier 20 on the enabling input god.

The reference-variation stage 32, controlled by the control unit 30, then determines successive variations (in this case, successive step-like increments) of the comparison reference voltage $V_x$ applied to the second input terminal 20b of the operational amplifier 20. In particular, the control unit 30 controls the DAC 32' for generation, in successive incremental steps, of the comparison reference voltage $V_x$ according to a staircase pattern.

At an initial instant $t_o$ and at a given value $V_x(t_o)$ of the comparison reference voltage $V_x$, the output terminal 20c of the operational amplifier 20 switches, since the value of the comparison reference voltage $V_x$ crosses the operating voltage $V_L$. The control unit 30 thus stops variation of the comparison reference voltage $V_x$ and stores the value $V_x(t_o)$, which corresponds to the initial value $V_L(t_o)$ of the reading voltage $V_L$, in the non-volatile memory 31.

Figure 6C:
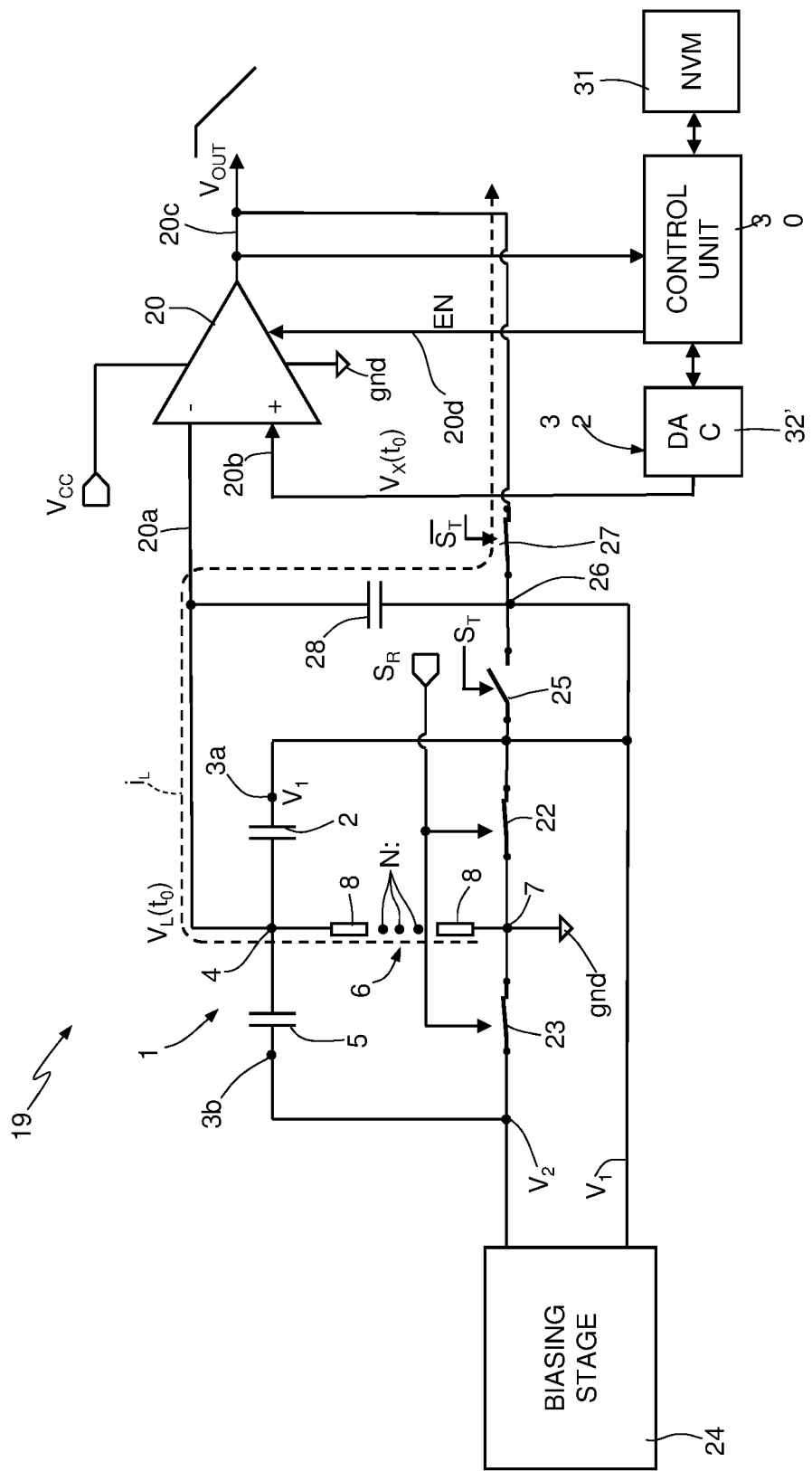

In the third step of the test procedure, as shown in FIG. 6c, the first and second switch elements 22, 23 are not switched (thus remaining in the closed state). The test control signal ST determines, instead, switching of the third switch element 25 into the open state and of the fourth switch element 27 into the closed state, thus uncoupling the test capacitor 28 from the storage capacitor 2 and enabling the feedback path of the operational amplifier 20, which is thus configured as a current integrator.

In particular, the reading voltage $V_L$ on the floating node 4 and on the discharge element 6 is from this moment kept constant by the operational amplifier 20, at the value $V_x(t_o)$. Furthermore, a path for discharge current $i_L$ (represented with a dashed line in FIG. 6c) is defined from the discharge element 6 to the test capacitor 28. The test capacitor 28 consequently integrates the current variation into the variation of output voltage $\Delta V_{out}$ (considered in the pre-set measurement time interval $\Delta T$).

In particular, the above variation of output voltage $\Delta V_{out}$ is given by the following expression (which represents the voltage/current relation in the test capacitor 28):

$$\Delta V_{out} \sim i_L \cdot \frac{\Delta T}{C_T} \sim \frac{V_x(t_0)}{R'_L} \cdot \frac{\Delta T}{C_T}$$

thus the expression with which the effective resistance $R_L'$ of the discharge element 6 may be measured:

$$R'_L \sim \frac{V_x(t_0)}{\Delta V_{out}} \cdot \frac{\Delta T}{C_T}.$$

This measurement, as discussed previously, represents the aim of the test procedure.

Figure 7:
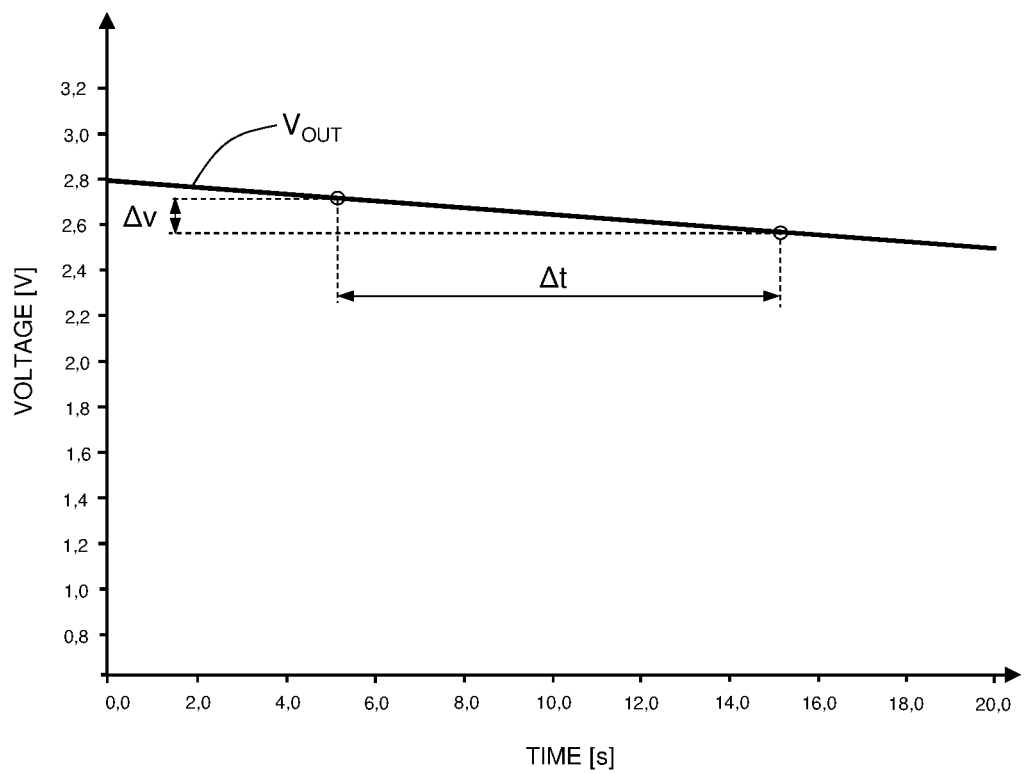
FIG. 7 shows a plot of electrical quantities associated to the testing circuit of FIG. 4.

FIG. 7 shows by way of example the plot of the output voltage $V_{out}$ during the aforesaid third step of the test procedure, in a possible example where the effective resistance $R_L'$ is 1 PΩ, the reading voltage $V_L(t_o)$ is 1.5 V, the discharge current $i_L$ is 1.5 fA, and the capacitance $C_T$ of the test capacitor 28 is 100 fF.

In particular, the output voltage $V_{out}$ undergoes a variation ΔV of approximately 150 mV in a measurement time interval ΔT of approximately 10 s. Advantageously, a variation of an amount that may be readily measured by an external test device is thus obtained, in a shorter time interval (much shorter than the duration of the discharge interval, for example, 3600 s), which is altogether compatible, for example, with the electrical testing operations to be carried out during the EWS procedure at the end of the manufacturing process.

A further aspect of the present solution is now described, which stems from the realization that in the storage capacitor 2 both positive charges (in which case, the reading voltage $V_L$ is positive) and negative charges (in which case, the reading voltage $V_L$ may, instead, be negative) may be stored. For reasons of reliability, it may indeed be required that the charge stored in the storage capacitor 2 might also be negative.

To be able to operate with negative reading voltages, the operational amplifier 20 would have to receive both a positive supply voltage $V_{cc}$ (>0) and a negative supply voltage. Furthermore, also the comparison reference voltage $V_x$ should be able to assume negative values (thus requiring a purposely provided circuit stage, for example, a charge-pump stage, for its generation).

In general, the presence of negative reading voltages $V_L$ would thus entail an increase in the circuit complexity, and a corresponding increase in the area occupation in the integrated implementation, as well as an increase in the electric-power consumption.

In addition, the need to set the negative circuitry (for example, for generation of the negative-voltage references) would require an increase in the latency times before carrying out the read operation, and would thus increase the duration of the test procedure.

The present Applicant has further realized that, when the electronic device in which the testing circuit 19 is incorporated is off (in the so-called power-off state), discharge paths towards ground could be generated, for example within biasing circuits connected to the biasing terminals 3a, 3b of the LTC stage 1 (for example, constituted by leakage paths of the junctions of MOS transistors); these discharge paths could affect the RC discharge time constant of the LTC stage 1, modifying it. In fact, the resistance towards ground constituted by the alternative leakage discharge paths could be comparable with the resistance $R_L$ of the discharge element 6 of the LTC stage 1. Basically, a significant spread of the value of the RC discharge time constant could arise.

Figure 8:
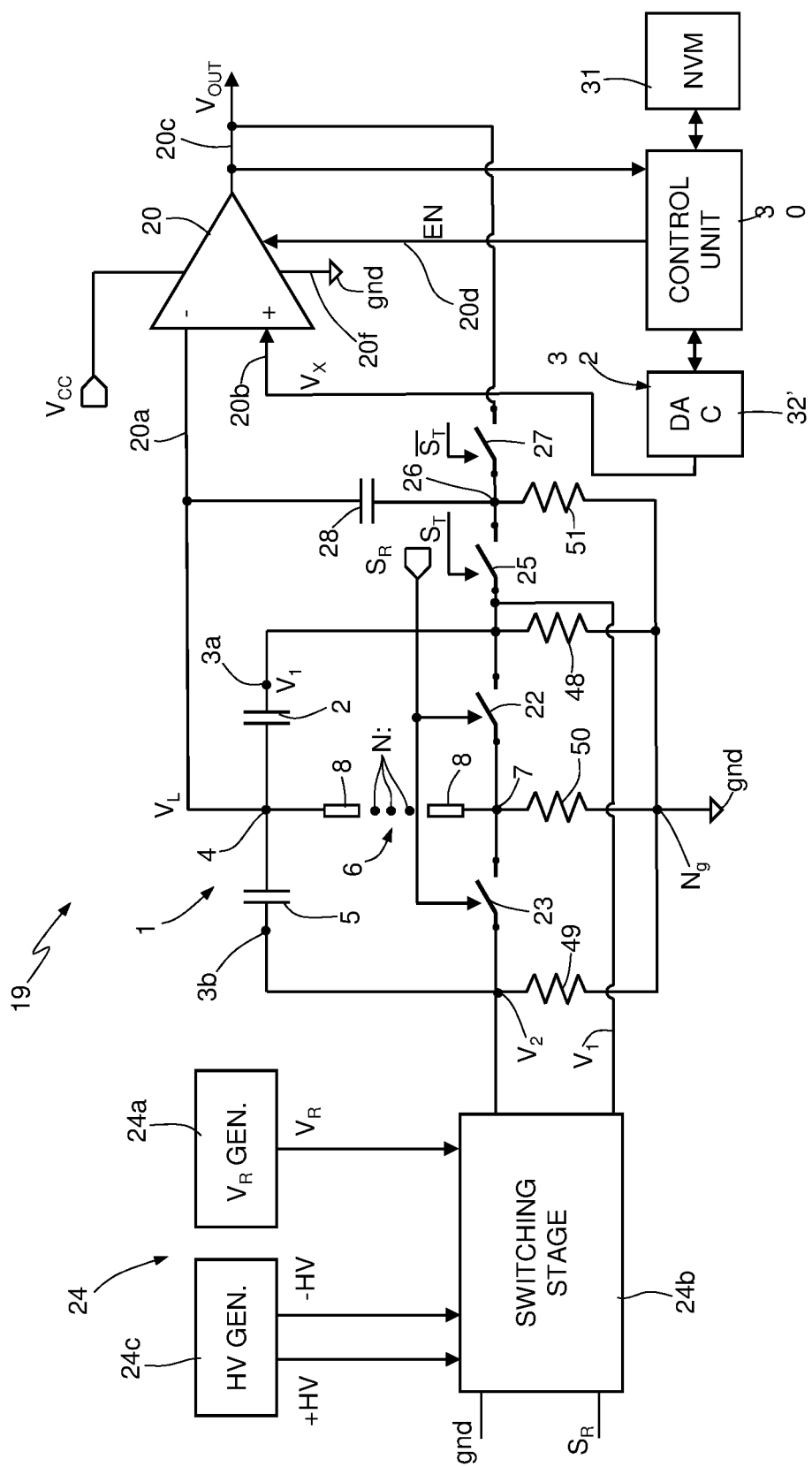
FIG. 8 shows a testing circuit for an LTC stage, according to a further embodiment of the present solution.

Given that it may be convenient, at least in certain operating conditions, to prevent onset of the above conditions, a further aspect of the present solution may thus envisage, as illustrated in FIG. 8, for the biasing stage 24 to include additional stages.

A generator stage 24a is configured to generate, for example starting from the positive supply voltage $V_{cc}$, a shifting voltage $V_R$, having an appropriate positive value (as described in detail hereinafter). A voltage-switching stage 24b, having a first voltage input and a second voltage input, which receive, respectively, the high positive voltage +HV and the high negative voltage −HV from a high-voltage generator stage 24c (of a known type, for example of the charge-pump type), a third voltage input, is connected to the generator stage 24a and receives the shifting voltage $V_R$, a fourth voltage input, which receives the ground voltage gnd, and also a control input, which receives the read control signal $S_R$. The voltage-switching stage 24b further has a first output and a second output, which are connected, respectively, to the first biasing terminal 3a and to the second biasing terminal 3b, to which it supplies the appropriate values of biasing voltage ($V_1$ and $V_2$) during the operating conditions of the testing circuit 19.

As illustrated once again in FIG. 8, in this embodiment, the testing circuit 19 may advantageously comprise a plurality of discharge resistors. For example, a first discharge resistor 48 is connected between the first biasing terminal 3a and a ground node $N_g$ set at ground voltage gnd, a second discharge resistor 49 is connected between the second biasing terminal 3b and the ground node $N_g$, a third discharge resistor 50 is connected between the reference terminal 7 and the ground node $N_g$, and a fourth discharge resistor 51 is connected between the internal node 26 and the aforesaid ground node $N_g$.

In particular, the value of resistance of the first, second, third, and fourth discharge resistors 48, 49, 50, 51 is much lower than the resistance of the discharge element 6, for example lower by at least one order of magnitude, for example being of the order of MΩ.

In the programming step, the value of resistance of the first, second, and third discharge resistors 48, 49, 50 is sufficiently high as to prevent an undesirable current consumption by the high-voltage generator stage 24c (and by the corresponding charge-pump circuits).

In the turning-off condition, advantageously the presence of the first and second discharge resistors 48, 49 further ensures the presence of an effective discharge path from the biasing terminals 3a, 3b to ground. In particular, this discharge path prevents generation of alternative discharge leakage paths that might vary the value of the RC discharge time constant.

Instead, the value of resistance of the above discharge resistors 48, 49 is such as not to alter the value of the same RC discharge time constant, being in fact considerably lower than the value of resistance $R_L$ of the discharge element 6.

Figure 9:
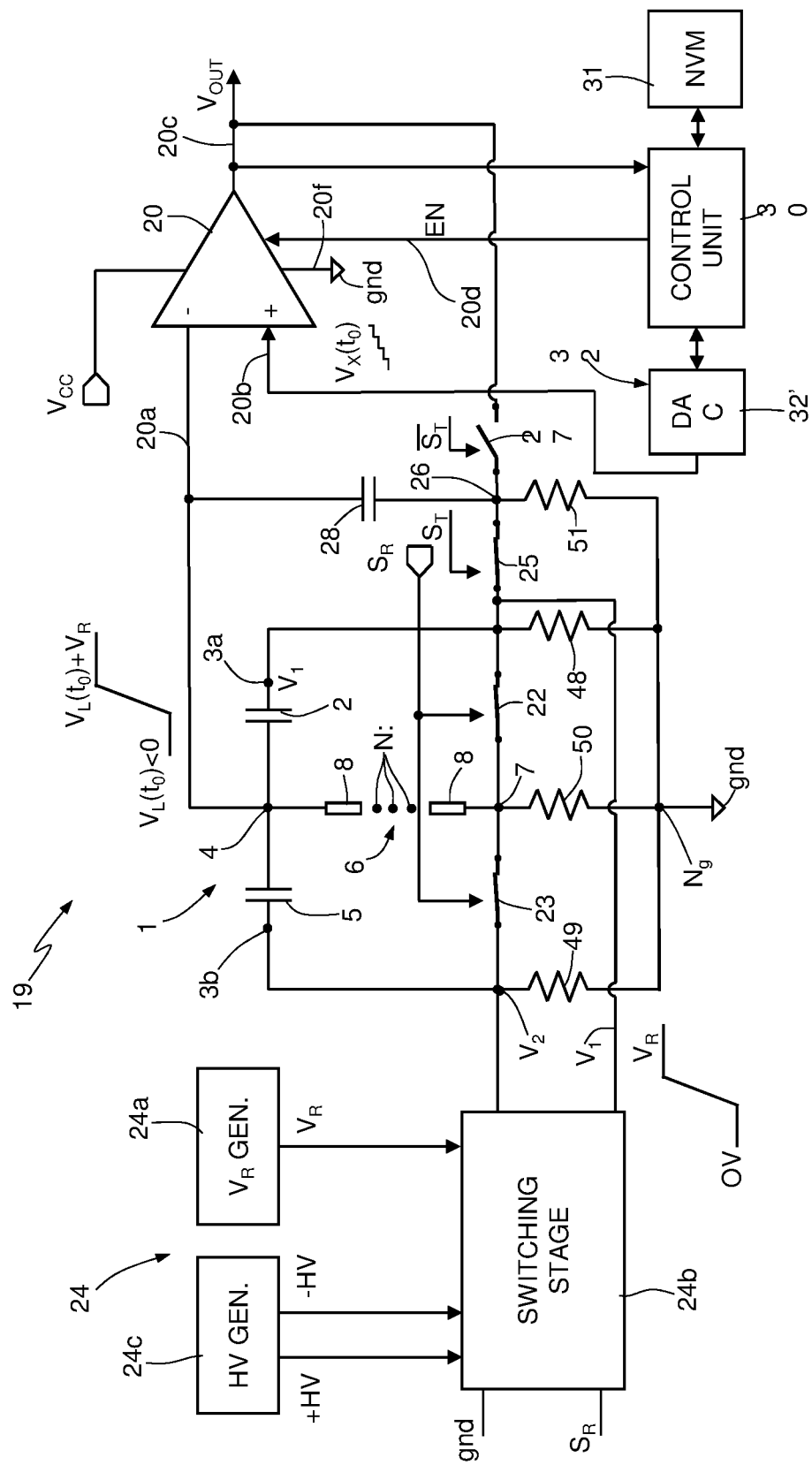
FIG. 9 shows the testing circuit of FIG. 8, in a test operating condition.

In this embodiment, as shown in FIG. 9, the second step of the test procedure, which follows the first programming step of the LTC stage, differs from the one illustrated previously with reference to FIG. 5B in that it envisages an appropriate shifting of the reading voltage $V_L$ to positive values.

The initial value of the reading voltage $V_L(t_o)$ is in fact in this case negative, for example −1.5 V. Consequently, after the read control signal $S_R$ has caused closing of the first and second switch elements 22, 23 (in this way shorting the first and second biasing terminals $3a$, $3b$), the voltage-switching stage $24b$ brings both the first biasing voltage $V_1$ and the second biasing voltage $V_2$ from ground to the shifting voltage $V_R$.

Consequently, the reading voltage $V_L$ increases instantaneously by a value equal to the shifting voltage $V_R$, assuming an incremented value: $V_L+V_R$.

In particular, the value of the shifting voltage $V_R$ is chosen so that, given the initial value $V_L(t_o)$ of the reading voltage $V_L$ assumed at the end of the programming step, the following relation is satisfied:

$$V_L(t_o)+V_R>0$$

For example, the value of the shifting voltage $V_R$ is 2.5 V, and the incremented value is initially 1 V.

The generator stage $24a$ and the voltage-switching stage $24b$ thus operate jointly as a stage for shifting the reading voltage $V_L$ of the floating node 4 so as to bring the same reading voltage $V_L$ to positive values (and within the operating voltage range accepted by the operational amplifier 20) before carrying out the read operation and the comparison with the comparison reference voltage $V_x$.

Furthermore, the value of the comparison reference voltage $V_x$ is chosen so that the following relation is satisfied:

$$V_{Lo}+V_R<V_x<V_R$$

It should be noted that, advantageously, the operational amplifier 20 in this way operates with only positive voltages at the input terminals $20a$, $20b$, and in this case comprises a first supply input, which receives a positive supply voltage $V_{cc}$ (>0), for example 3.5 V, and a second supply input, which receives the ground voltage gnd. In other words, the operational amplifier 20 is configured to work in just the interval of positive voltages and does not receive any negative supply voltage.

During the step of measurement of the initial value $V_L(t_o)$ of the reading voltage $V_L$, on the hypothesis that a negative charge has been stored in the storage capacitor 2, the reading voltage $V_L$ from the initial value $V_L(t_o)$, which is negative, goes to ground. Consequently, the incremented value $V_L+V_R$ evolves from the initial value $V_L(t_o)+V_R$ to the value of the shifting voltage $V_R$.

When this incremented value crosses the value of the comparison reference voltage $V_x$ (each time incremented by the reference-variation stage 32, as discussed previously), the output of the operational amplifier 20 switches, or triggers, and the output voltage $V_{out}$ assumes a value (for example, a high value) indicating that the value of the reading voltage $V_L$ has been determined.

In this case, the following expression for the initial value $V_L(t_o)$ of the reading voltage $V_L$ thus applies:

$$V_x(t_o)\approx V_L(t_o)+V_R$$

Consequently, in the subsequent operating step of the test procedure, i.e., the step of integration of the discharge current $i_L$, the following expression is used for determining the effective value $R_L'$ of the resistance of the discharge element 6:

$$R_L' \sim \frac{V_x(t_0)-V_R}{\Delta V_{out}} \cdot \frac{\Delta T}{C_T}$$

Next, the value of the reference voltage $V_x$ may again be adjusted as a function of the aforesaid effective value $R_L'$.

The advantages of the solution proposed emerge clearly from the foregoing description.

In any case, it is once again emphasized that the testing circuit 19 allows solving the problems highlighted previously in so far as it enables a measurement of the effective resistance $R_L'$ of the discharge element 6 of the LTC stage 1 to be carried out so as to ensure, during operation, the desired duration of the discharge interval, and in any case so as to ensure that the same duration will not have a spread greater than +/−20%.

The test procedure is sufficiently fast as to be compatible with the electrical-test procedures commonly carried out at the end of the processes for manufacturing electronic devices (the so-called EWS procedures).

Furthermore, the testing circuit 19 is configured to not interfere with the operations of programming, erasure, and reading of the LTC stage 1 and thus with normal operation of the same LTC stage 1, both during its electrical testing and during subsequent use for measurement of time interval.

In particular, it is advantageous the possibility of disabling the feedback path of the operational amplifier 20 by opening the fourth switch element 27 and also the possibility to connect in parallel the storage capacitor 2 and the test capacitor 8, advantageously provided as split of the same storage capacitor 2, by the third switch element 25. The sum of the capacitances of the test capacitor 8 and of the storage capacitor 2 is designed to provide the desired RC discharge time constant.

The operational amplifier 20, configured as a comparator, may thus be used, in a usual way, for the operations of reading of the residual charge in the storage element 2, for measurement of the discharge time interval.

The testing circuit 19 may possibly be activated for carrying out, for example at periodic intervals during the service life of the LTC stage 1, the test procedure and guarantee, during time and in an automatic manner, that the desired duration of the discharge time interval is maintained.

The testing circuit 19 further enables use of an operational amplifier 20 that operates just with positive voltages, thus preventing the need for purposely provided circuits for generation of negative references, and further preventing the associated reading delays.

The testing circuit 19 reduces the spread of the value of the discharge time constant, in particular during the turning-off condition, thanks to the introduction of the effective resistive discharge paths towards the ground terminal.

Basically, the solution described enables increase in the performance and operating reliability of the LTC stage 1.

Figure 10:
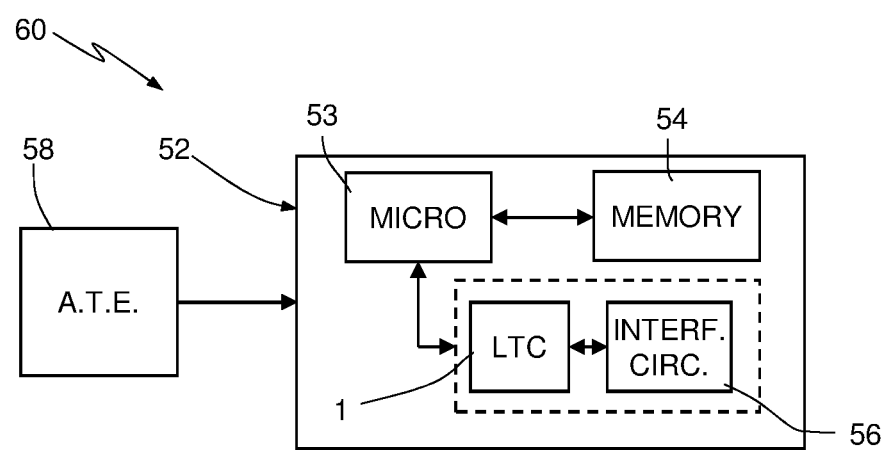
FIG. 10 is a general block diagram of an electronic device that incorporates the LTC stage and the corresponding testing circuit, according to a further aspect of the present solution.

The aforesaid characteristics thus render advantageous use of the LTC stage 1 and of the associated testing circuit 19 in an electronic device 52, for example for secure applications, as illustrated schematically in FIG. 10.

The electronic device 52 comprises a supervision unit 53, for example of the microprocessor or microcontroller type, which supervises its general operation, and a memory 54, of a non-volatile type, operatively coupled to the supervision unit 53.

The electronic device 52 further comprises the LTC stage 1 and an associated electronic interface circuit 56, including the testing circuit 19 and possible further circuits, for example, biasing circuits (not illustrated herein).

In particular, the supervision unit 53, upon detection of an attack attempt (for example, upon detection of an unauthorized access to the information stored in the memory 54), may cause a blocking state of the electronic device 52. The supervision unit 53 may further read, for example at regular intervals, the residual charge stored in the storage capacitor 2 of the LTC stage 1 in order to cause exit from the blocking state, at the end of the wait interval having a desired duration.

Moreover, as illustrated once again in FIG. 10, in a testing step, the electronic device 52 (or, alternatively, the testing circuit 19) may advantageously interface with an electrical-test apparatus 58, for example of the so-called automatic-test-equipment (ATE) type, which is able to interact with the testing circuit 19 for implementing the test procedure previously described, in order to determine the effective value $R_L'$ of the resistance of the discharge element 6 of the LTC stage 1 and to adjust accordingly the value of the comparison reference voltage $V_x$, thus obtaining the desired value of the duration of the discharge interval.

For example, the electrical-test apparatus 58 may supply appropriate control signals to the control unit 30 of the testing circuit 19 in order to start and manage the test procedure, thus constituting as a whole an electrical testing system 60.

The electronic device 52 may advantageously be integrated in a portable mobile-communication apparatus (not illustrated), such as a cellphone, a smartphone, a personal digital assistant (PDA), a digital audio player with voice-recording capacity, a photographic camera or video camera, a controller for videogames, etc., or a wearable apparatus, such as a smartwatch or an electronic bracelet.

Finally, it is clear that modifications and variations may be made to what is described and illustrated herein, without thereby departing from the scope of the present invention, as defined in the annexed claims.

For example, it is evident that the numeric values indicated for the voltages acting in the testing circuit 19 are to be understood as provided purely by way of example; indeed, in an equivalent manner, different values may be envisaged, according to the particular operating requirements.

Furthermore, the LTC stage 1 and the corresponding testing circuit 19 may be used in different electronic devices, in general for secure applications. Other uses may in any case be envisaged, for example in the field of management of the timing for access rights to multimedia contents.

What is claimed is:

1. A test circuit comprising:
a charge-retention circuit for measurement of a time interval, the charge-retention circuit comprising a storage capacitor connected between a first biasing terminal and a floating node, and a discharge element connected between the floating node and a reference terminal, the discharge element configured to implement discharge of a charge stored in the storage capacitor by leakage through a corresponding dielectric,
a biasing stage, configured to bias the floating node at a reading voltage;
a detection stage configured to detect a biasing value of the reading voltage; and
an integrator stage, including a test capacitor coupled to the floating node, configured to implement an operation of integration of a discharge current in the discharge element with the reading voltage kept constant at the biasing value, and to determine an effective resistance value of the discharge element as a function of the operation of integration.

2. The test circuit according to claim 1, wherein the biasing stage comprises a shifting stage, configured to carry out shifting of the value of the reading voltage of the floating node, from a negative value to a positive value, before the detection stage detects a biasing value thereof.

3. The test circuit according to claim 2, wherein the shifting stage comprises:
a generator stage configured to generate a shifting voltage; and
a switching stage, configured to receive the shifting voltage and switch a voltage of the first biasing terminal and second biasing terminal from a reference voltage to the shifting voltage, following upon biasing of the floating node at the reading voltage.

4. The test circuit according to claim 1, further comprising:
a first discharge resistor coupled between the first biasing terminal and a ground node set at a ground voltage, wherein a resistance value of the first discharge resistor is lower than a resistance value of the discharge element by at least one order of magnitude; and
a second discharge resistor coupled between a second biasing terminal and a ground node, wherein a resistance value of the second discharge resistor is lower than the resistance value of the discharge element by at least one order of magnitude.

5. The test circuit according to claim 1, wherein the biasing stage comprises a switching stage, configured to receive a positive biasing voltage and a negative biasing voltage and switch a respective biasing voltage of the first biasing terminal and a second biasing terminal to the value of the positive biasing voltage, or of the negative biasing voltage, so as to inject charges into, or extract charges from, the storage capacitor.

6. The test circuit according to claim 1, wherein the charge-retention circuit further comprises a transfer capacitor coupled between a second biasing terminal and the floating node, wherein the transfer capacitor is configured to inject charges into, or extract charges from, the storage capacitor by a tunnel effect.

7. An electronic device, comprising:
a supervision unit;
a non-volatile memory operatively coupled to the supervision unit; and
the test circuit according to claim 1 operatively coupled to the supervision unit.

8. An electrical testing system, comprising:
the test circuit according to claim 1; and
an electrical testing apparatus, operatively coupled to the test circuit for implementing a test procedure designed to determine an effective value of the resistance of the discharge element of the charge-retention circuit and to adjust accordingly the value of a comparison reference voltage, to obtain a desired value of duration of a discharge interval associated to the discharge element.

9. A test circuit comprising:
a charge-retention circuit for measurement of a time interval, the charge-retention circuit comprising a storage capacitor connected between a first biasing terminal and a floating node, and a discharge element connected between the floating node and a reference terminal, the discharge element configured to implement discharge of a charge stored in the storage capacitor by leakage through a corresponding dielectric,
a biasing stage, configured to bias the floating node at a reading voltage;
a detection stage configured to detect a biasing value of the reading voltage; and
an integrator stage, including a test capacitor coupled to the floating node, configured to implement an operation of integration of a discharge current in the discharge element with the reading voltage kept constant at the biasing value, and to determine an effective resistance value of the discharge element as a function of the operation of integration, wherein the integrator stage further comprises an operational amplifier, having a first input terminal connected to the floating node and configured to receive the reading voltage, a second input terminal configured to receive a comparison reference voltage, the value of which is kept constant at the biasing value during the operation of integration, and an output terminal on which it is configured to supply an output voltage, wherein the test capacitor is selectively connected between the first input terminal and the output terminal during the operation of integration.

10. The test circuit according to claim 9, wherein the output voltage, during the operation of integration, has a voltage variation in a measurement time interval, and wherein the effective resistance value is a function according to the expression $$R'_L \sim \frac{V_x(t_0)}{\Delta V_{out}} \cdot \frac{\Delta T}{C_T}$$

where $R_L'$ is the effective resistance value, $\Delta$Vout is the voltage variation, $\Delta T$ is the measurement time interval, Vx(to) is the constant value of the comparison reference voltage, and $C_T$ is a capacitance value of the test capacitor.

11. The test circuit according to claim 9, wherein the detection stage comprises:
a control unit; and
a reference-variation stage coupled to the control unit and controlled by the control unit for varying iteratively the value of the comparison reference voltage supplied to the second input terminal of the operational amplifier, which is configured to operate as a comparator, wherein, upon switching of the output voltage of the operational amplifier, the value of the comparison reference voltage corresponds to the biasing value.

12. The test circuit according to claim 11, wherein the detection stage further comprises a non-volatile memory coupled to the control unit and configured to store the value of the comparison reference voltage corresponding to the biasing value.

13. The test circuit according to claim 11, wherein the reference-variation stage comprises a digital-to-analog converter configured to generate, with successive incremental steps, incremental values of the comparison reference voltage according to a staircase ramp pattern.

14. The test circuit according to claim 9, further comprising:
a coupling switch element connected between the first biasing terminal and an internal node and driven by a test control signal, wherein the test capacitor is connected between the floating node and the internal node; and
a feedback switch element connected between the internal node and an output terminal of the operational amplifier and driven by a negated version of the test control signal.

15. The test circuit according to claim 14, wherein a capacitance value of the test capacitor is a fraction of a respective capacitance value of the storage capacitor;
wherein, during the operation of integration, the feedback switch element is configured to be driven into a closed state to selectively define a feedback path, and, outside of the operation of integration, is configured to be driven into an open state in order to interrupt the feedback path; and
wherein the coupling switch element is configured to selectively couple in parallel the test capacitor and the storage capacitor outside of the operation of integration in order to define jointly a discharge capacitance coupled to the discharge element.

16. The test circuit according to claim 9, further comprising a reference-variation stage, configured to set the value of a comparison reference voltage supplied on a second input of the operational amplifier as a function of the effective resistance value of the discharge element.

17. A method for testing a charge-retention circuit for measurement of a time interval having a storage capacitor coupled between a first biasing terminal and a floating node, and a discharge element coupled between the floating node and a reference terminal, the discharge element configured to implement discharge of a charge stored in the storage capacitor by leakage through a corresponding dielectric, the method comprising:
biasing the floating node at a reading voltage;
detecting a biasing value of the reading voltage;
implementing an operation of integration of the discharge current in the discharge element with the reading voltage kept constant at the biasing value; and
determining an effective resistance value of the discharge element as a function of the operation of integration.

18. The method according to claim 17, wherein implementing the operation of integration comprises integrating the discharge current in the discharge element using an operational amplifier, having a first input terminal coupled to the floating node and coupled to receive the reading voltage, a second input terminal coupled to receive a comparison reference voltage having a value that is kept constant at the biasing value during the operation of integration, an output terminal configured to supply an output voltage, and a test capacitor selectively connected between the first input terminal and the output terminal during the operation of integration.

19. The method according to claim 18, wherein the output voltage, during the operation of integration, has a voltage variation in a measurement time interval, and wherein the effective resistance value is a function according to the expression $$R'_L \sim \frac{V_x(t_0)}{\Delta V_{out}} \cdot \frac{\Delta T}{C_T}$$

where $R_L'$ is the effective resistance value, $\Delta$Vout is the voltage variation, $\Delta T$ is the measurement time interval, Vx(to) is the constant value of the comparison reference voltage, and $C_T$ is a capacitance value of the test capacitor.

20. The method according to claim 18, wherein the detecting comprises iteratively varying the value of the comparison reference voltage supplied to the second input terminal of the operational amplifier, which operates as a comparator, wherein, upon switching of the output voltage of the operational amplifier, the value of the comparison reference voltage corresponds to a biasing value.

21. The method according to claim 17, further comprising carrying out a shifting of the value of the reading voltage of the floating node from a negative value to a positive value, prior to detecting a biasing value of the reading voltage.

22. The method according to claim 21, wherein carrying out the shifting comprises:
  generating a shifting voltage; and
  switching a voltage of the first biasing terminal and a second biasing terminal from a reference voltage to the shifting voltage, following upon biasing of the floating node at the reading voltage.

* * * * *